United States Patent
Kim et al.

(10) Patent No.: US 8,716,690 B2
(45) Date of Patent: May 6, 2014

(54) VARIABLE RESISTOR, NON-VOLATILE MEMORY DEVICE USING THE SAME, AND METHODS OF FABRICATING THE SAME

(71) Applicants: SK hynix Inc., Icheon-si (KR); Korea University Research and Business Foundation, Seoul (KR)

(72) Inventors: Woong Kim, Seoul (KR); Yong chan Ju, Gwangmyeong-si (KR); Seungwook Kim, Daegu (KR)

(73) Assignees: SK Hynic Inc., Icheon (KR); Korea University Research and Business Foundation, Seoul (KR)

( * ) Notice: Subject to any disclaimer, the term of this patent is extended or adjusted under 35 U.S.C. 154(b) by 12 days.

(21) Appl. No.: 13/689,390

(22) Filed: Nov. 29, 2012

(65) Prior Publication Data

US 2013/0134374 A1    May 30, 2013

(30) Foreign Application Priority Data

Nov. 29, 2011    (KR) .................. 10-2011-0126388

(51) Int. Cl.
*H01L 29/02*    (2006.01)
(52) U.S. Cl.
USPC ..... 257/2; 257/3; 257/4; 257/5; 257/E29.002; 438/102; 438/103; 438/104; 365/163

(58) Field of Classification Search
CPC ......... H01L 45/04; H01L 29/00; H01L 27/24; G11C 13/004
USPC .................. 257/1–5, E29.002; 438/102–104; 365/163
See application file for complete search history.

(56) References Cited

U.S. PATENT DOCUMENTS

| | | | |
|---|---|---|---|
| 2006/0254502 A1* | 11/2006 | Garrou et al. ................... | 117/84 |
| 2010/0001252 A1 | 1/2010 | Symanczyk et al. | |
| 2011/0160512 A1 | 6/2011 | Ghiaci et al. | |

* cited by examiner

*Primary Examiner* — Jami M Valentine

(57) ABSTRACT

A variable resistor, a nonvolatile memory device and methods of fabricating the same are provided. The variable resistor includes an anode electrode and a cathode electrode, a variable resistive layer including CdS nanoscale particles provided between the anode electrode and the cathode electrode, and an initial metal atom diffusion layer within the variable resistive layer. The variable resistor is a bipolar switching element and configured to be in a reset state when a positive voltage relative to a cathode electrode is applied to the anode electrode, and configured to be in a set state when a negative voltage relative to the cathode electrode is applied to the anode electrode.

17 Claims, 13 Drawing Sheets

VARIABLE RESISTOR, NON-VOLATILE MEMORY DEVICE USING THE SAME, AND METHODS OF FABRICATING THE SAME

CROSS-REFERENCE TO RELATED APPLICATION

The present application claims priority under 35 U.S.C. 119 (a) to Korean application number 10-2011-0126388, filed on Nov. 29, 2011, in the Korean Patent Office, which is incorporated by reference in its entirety.

BACKGROUND

1. Technical Field

The exemplary embodiments relate to semiconductor technology, and more particularly, to a variable resistor, a nonvolatile memory device using the same, and methods of fabricating the same.

2. Related Art

In recent years, with increase in demand for portable digital application devices such as digital cameras, MP3 players, personal digital assistants (PDAs), and portable phones, the nonvolatile memory market is rapidly expanding. As flash memory devices which are programmable nonvolatile memory devices reach the limit of scaling, nonvolatile memory devices such as phase-change random access memory (PcRAM) devices or resistive random access memory (ReRAM) devices using a variable resistor of which a resistance value is reversibly changed, have received attention as nonvolatile memory devices which are an alternative to the flash memory devices. Since the nonvolatile memory devices utilize their intrinsic physical properties as data digits, a memory cell configuration is simple and thus high densification of the memory device is realized.

Compared with the PcRAM devices, ReRAM devices are advantageous in that pulse control over the device is easy and driving current is low. Thus, it is advantageous in terms of scalability and power consumption. The ReRAM devices include (i) a unipolar switching type in which a set voltage and a reset voltage are exhibited at the same polarity state, and (ii) a bipolar switching type in which the set voltage and the reset voltage are exhibited at different polarity states. In general, the ReRAM device of a bipolar switching type has a stable resistive switching characteristic as compared with the ReRAM device of a unipolar switching type, because the bipolar switching type has a stable resistive switching characteristic and is capable of being driven with relatively low current.

SUMMARY

One or more exemplary embodiments are provided with reference to a variable resistor having a good cycle characteristic and good reliability with a bipolar switching property.

One or more exemplary embodiments are provided with reference to a nonvolatile memory device including a variable resistor having one or more of the above-described advantages.

One or more exemplary embodiments are provided with reference to a method of fabricating a variable resistor which is capable of obtaining a uniform film structure over an entire device area to provide reproducibility and reliability, obtaining a large size with a low cost for good economics.

One or more exemplary embodiments are provided to a method of fabricating a nonvolatile memory device having a variable resistor having one or more of the above-described advantages.

According to one aspect of an exemplary embodiment, there is a provided a variable resistor. The variable resistor may include: an anode electrode and a cathode electrode; a variable resistive layer including cadmium sulfur (CdS) nanoscale particles between the anode electrode and the cathode electrode; and an initial metal atom diffusion layer within the variable resistive layer. The variable resistor may be driven in a bipolar switching type, so that a relatively positive voltage is applied to the anode electrode with respect to the cathode electrode thereby being in a reset state, and a relatively negative voltage is applied to the anode electrode with respective to the cathode electrode thereby being in a set state. In some embodiments, an initial metal atom diffusion layer may include metal elements thermally diffused from the anode electrode into the variable resistive layer.

According to another aspect of an exemplary embodiment, there is a provided a variable resistor. The variable resistor may include: an anode electrode and a cathode electrode; a variable resistive layer including cadmium sulfide (CdS) nanoscale particles between the anode electrode and the cathode electrode; and a diffusion barrier layer between the anode electrode and the variable resistive layer. The variable resistor may be driven in a bipolar switching type, so that a relatively positive voltage is applied to the anode electrode with respect to the cathode electrode thereby being in a set state, and a relatively negative voltage is applied to the anode electrode with respective to the cathode electrode thereby being in a reset state.

In some embodiments, the diffusion barrier layer may include $SiO_x$, $AlO_x$, $NbO_x$, $TiO_x$, $CrO_x$, $VO_x$, $TaO_x$, $CuO_x$, $MgO_x$, $WO_x$, $AlNO_x$, or any combination thereof. The diffusion barrier layer may include a native oxide.

In some embodiments, a thickness of the diffusion barrier layer may be in a range of between about 3 nm to 10 nm. A ratio of the thickness of the diffusion barrier layer to a thickness of the variable resistive layer may be in a range of between about 0.03 to 0.1.

In some embodiments, the CdS nanoscale particles may have an average particle diameter of between about 5 nm to 20 nm over the entire variable resistive layer. The average particle diameter of the CdS nanoscale particles may have a standard deviation of below about 4 nm over the entire variable resistive layer.

The CdS nanoscale particles may have a Wurtzite structure, a zinc blende structure, or a combination structure thereof. The CdS nanoscale particles may satisfy substantially 1:1 stoichiometry.

In some embodiments, the anode electrode may comprise silver (Ag), tellurium (Te), copper (Cu), nickel (Ni), zinc (Zn), or any combination thereof. The cathode electrode may comprise tungsten (W), gold (Au), platinum (Pt), palladium (Pd), rhodium (Rh), iridium (Ir), ruthenium (Ru), titanium (Ti), tantalum (Ta), molybdenum (Mo), chrome (Cr), vanadium (V), a nitride thereof, a silicide thereof, or any combination thereof.

In some embodiments, the anode electrode may further include a metal ion supplying layer. The metal ion supplying layer may include a compound of germanium selenium (GeSe), a compound of germanium sulfur (GeS), a compound of copper sulfur (CuS), a compound of silver sulfur (AgS), or any combination thereof. In some embodiments, the variable resistor may be formed on a flexible substrate.

According to another aspect of an exemplary embodiment, there is a provided a nonvolatile memory device including the variable resistor. According to another aspect of an exemplary embodiment, there is a provided a fuse device including the variable resistor. According to another aspect of an exemplary embodiment, there is a provided a logic circuit using a variable resistor as a switching element.

According to another aspect of an exemplary embodiment, there is provided a method of fabricating a variable resistor. The method may include: delivering a dispersion solution of cadmium sulfur (CdS) nanoscale particles on a first electrode which is any one of an anode electrode and a cathode electrode; calcinating the delivered dispersion solution to form a variable resistive layer including the CdS nanoscale particles; and forming a second electrode (which is the other of the anode electrode and the cathode electrode) on the variable resistive layer.

In some embodiments, the CdS nanoscale particles may be obtained by a nanoparticle synthesis process including preparing a first solution obtained by dissolving and decomposing a cadmium (Cd) precursor in a first solvent; preparing a second solution by dissolving sulfur particles in a second solvent which is the same as the first solvent or miscible with the first solvent; forming a mixed solution of the first solution and the second solution; forming the CdS nanoscale particles by heating and agitating the mixed solution; and collecting the CdS nanoscale particles from the mixed solution.

In some embodiments, the first solvent may include octylamine, trioctylamine, decylamine, dodecylamine, tetradecylamine, hexadecylamine, oleylamine, octadecylamine, tribenzylamine, triphenylamine, or C8- to C24-based surfactants.

The cadmium precursor may include CdS chloride. A dispersion solvent of the dispersion solution may include a single solvent comprising chloroform, N-methylpyrrolidone, acetone, cyclopentanone, cyclohexanone, methylethylketone, ethylcellosolveacetate, butylacetate, ethyleneglycol, xylene, tetrahydrofuran, dimethylformamide, chlorobenzene, acetonitrile, or a mixed solvent in which two or more of solvents are mixed at a certain ratio.

In some embodiments, the delivering a dispersion solution may be performed by droplet coating. The droplet coating may be performed by a dropcasting or inkjet process.

The calcinating the delivered dispersion solution may be performed by native drying at a room temperature. The forming of a variable resistive layer may further include performing a heat treatment after the native drying.

In some embodiments, the first electrode may be the cathode electrode and the second electrode may be the anode electrode. The method may further include heat-treating the anode electrode to form an initial metal atom diffusion layer including metal elements (which are diffused from the anode electrode into the variable resistive layer), within the variable resistive layer. In another embodiment, the first electrode may be the cathode electrode and the second electrode may be the anode electrode. The method may further include forming a diffusion barrier layer on the variable resistive layer before heat-treating the anode electrode.

The diffusion barrier layer may include $SiO_x$, $AlO_x$, $NbO_x$, $TiO_x$, $CrO_x$, $VO_x$, $TaO_x$, $CuO_x$, $MgO_x$, $WO_x$, $AlNO_x$, or any combination thereof. The forming of a diffusion barrier layer may include forming a metal layer and performing native oxidation on the metal layer.

In some embodiments, a thickness of the diffusion barrier layer may be in a range of between about 3 nm to 10 nm. A ratio of the thickness of the diffusion barrier layer to a thickness of the variable resistive layer may be in a range of between about 0.03 and 0.1.

According to another aspect of an exemplary embodiment, there is provided a method of fabricating a nonvolatile memory device using the method of fabricating a variable resistor.

According to exemplary embodiments, it is possible to provide a variable resistor having a good cycle characteristic and reliability with a bipolar switching property, by providing an initial metal atom diffusion layer within a variable resistive layer including CdS nanoscale particles. In addition, according to other exemplary embodiments, it is possible to provide a variable resistor in which a polarity of a bipolar switching property is reversed by providing a diffusion barrier layer between an anode electrode and the variable resistive layer with respect to the former variable resistor.

According to certain exemplary embodiments, it is possible to provide a rewritable nonvolatile memory device, a fuse structure such as a fuse and an antifuse, and a logic circuit using the cycle characteristic of the variable resistive layer.

According to certain exemplary embodiments, it is possible to provide the variable resistor having a uniform film quality characteristic over the entire variable resistive layer and ensuring a large-sized film as compared with a conventional vapor-phase deposition method. This may be done using the CdS nanoscale particles, which satisfy a stoichiometry and have a uniform size and shape, through synthesis of the CdS nanoscale particles in a solution and forming the variable resistive layer through coating and calcinating droplets on a substrate in a dispersion solution state of the CdS nanoscale particles.

In addition, according to an exemplary embodiment, it is possible to perform a method of fabricating a nonvolatile memory device with reliability and economic advantage, the method being capable of obtaining a high quality variable resistor without using high expensive vacuum apparatus and a starting material.

These and other features, aspects, and embodiments are described below in the section entitled "DETAILED DESCRIPTION".

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Figure 1A:
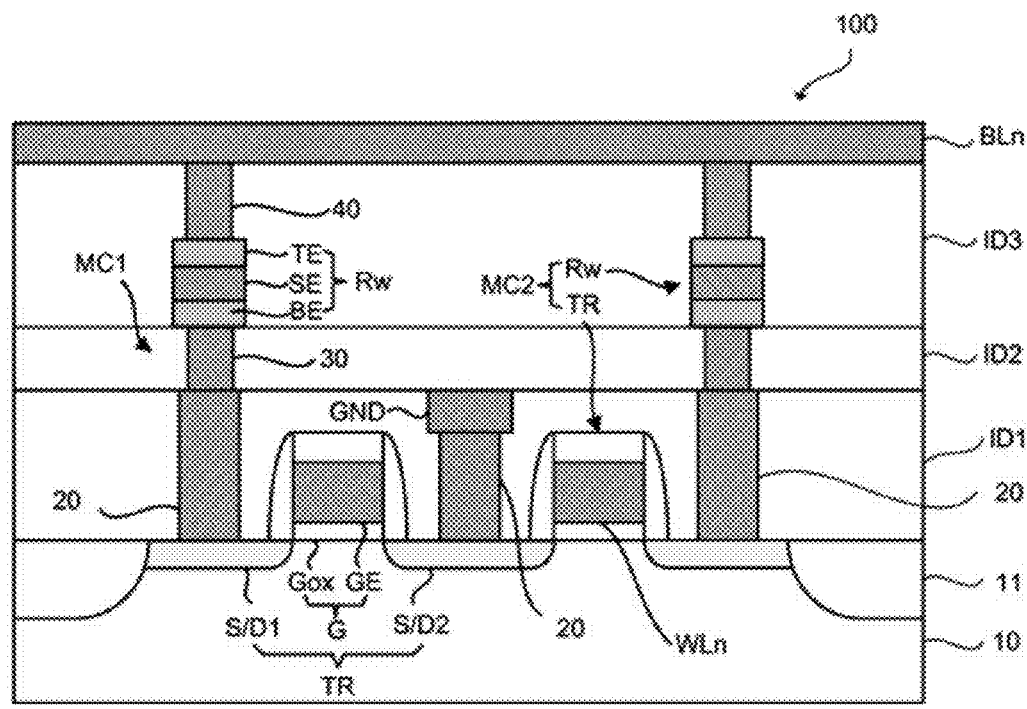
FIGS. 1a and 1b are a cross-sectional view and an equivalent circuit diagram illustrating a plurality of memory cells of a nonvolatile memory device, respectively, according to an exemplary embodiment.

Hereinafter, exemplary embodiments will be described in greater detail with reference to the accompanying drawings.

Embodiments may take many different forms and should not be construed as being limited to those set forth herein. Rather, these embodiments are provided so that this disclosure will be thorough and complete, and will fully convey the concept of the invention to those skilled in the art.

Like reference numerals in the drawings denote like elements. The term "and/or" used herein includes any one of listed items or a combination of two or more thereof.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or the group thereof, but do not preclude the presence or addition of one or more other features, integers, steps, operations, elements, components, and/or groups thereof.

It is also understood that when a layer is referred to as being "on" another layer or substrate, it can be directly on the other or substrate or intervening layers or layers formed in the intervening layers may also be present. It will be clearly understood by those skilled in the art that a structure or shape "adjacent to" another shape may have a portion overlapping the other shape or a portion below the other shape.

Spatially relative terms, such as "below", "above", "upper", "lower" "horizontal", or "vertical", may be used herein for ease of description to describe one element, layer, or region's relationship to another element(s), layer(s), or region(s) as illustrated in the figures. It will be understood that the spatially relative terms are intended to encompass different orientations of the device in use or operation in addition to the orientation depicted in the figures.

Exemplary embodiments are described herein with reference to cross-sectional illustrations that are schematic illustrations of exemplary embodiments (and intermediate structures). As such, variations from the shapes of the illustrations as a result, for example, of fabricating techniques and/or tolerances, may be expected. Thus, exemplary embodiments should not be construed as limited to the particular shapes of regions illustrated herein but may be to include deviations in shapes that result, for example, from fabricating. In the drawings, lengths and sizes of layers and regions may be exaggerated for clarity.

Figure 1B:
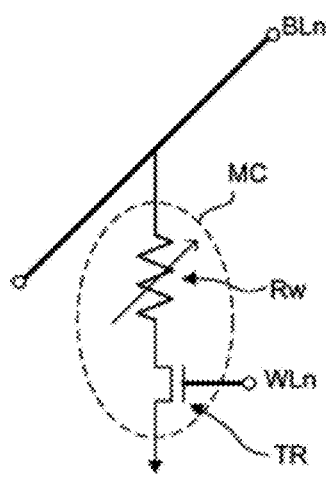

FIG. 1a is a cross-sectional view of a plurality of memory cells (MCs) MC1 and MC2 of a nonvolatile memory device 100 according to an exemplary embodiment, and FIG. 1b is an equivalent circuit diagram of any of the plurality of memory cells MCs of FIG. 1a.

Referring to FIGS. 1a and 1b, each of the memory cells MC, MC1, and MC2 according to an exemplary embodiment may include a variable resistor RW configured to store information, and a transistor TR configured to select a specific memory cell. One terminal of the variable resistor Rw may be connected to a bit line BLn and the other terminal thereof may be connected to a source S/D1 of the transistor TR. A drain S/D2 of the transistor TR may be grounded (GND) or may be coupled to a reference voltage. A gate of the transistor TR may be connected to a word line WLn configured to receive an activation signal.

A substrate 10 may include a base structure such as silicon, silicon-on-insulator (SOI), silicon-on-sapphire (SOS), a semiconductor layer formed on another base structure which is not a semiconductor, a doped or undoped semiconductor layer, or a modified semiconductor layer. The base structure and semiconductor layer are not limited to a silicon-based material. The base structure and/or the semiconductor layer may include a group III-V semiconductor material such as silicon-germanium (SiGe), Ge, or a gallium-arsenide (GaAs)-based compound material, a group II-VI semiconductor material such as zinc sulfide (ZnS), zinc selenide (ZnSe), or cadmium selenide (CdSe), a mixed semiconductor material, an oxide semiconductor material such as zinc oxide (ZnO), magnesium oxide (MgO), or MO$_2$, a nanoscale material such as carbon nanocrystal, or any combination thereof.

In an embodiment, the substrate 10 may have flexibility to implement a flexible memory device and in this case, the substrate 10 may include a resin-based material. The resin-based material may include any of various kinds of cellulose-based resin; polyester such as polyethyleneterephthalate (PET) and polyethylene naphthalate (PEN); a polyethylene resin; a polyvinyl chloride resin; polycarbonate (PC); polyethersulfone (PES); polyether ether ketone (PEEK); and polyphenylene sulfide (PPS); or any combination thereof. However, the above materials are only illustrative and embodiments are not limited thereto.

The transistor TR may be formed in an active region of the substrate 10 defined by a field isolation region 11 such as shallow trench isolation (STI). The transistor TR may be a field effect transistor (FET) including a gate G having a gate insulating layer Gox and a gate electrode GE formed on the active region and source and drain S/D1 and S/D2 spaced apart from each other by the gate G.

In case that the substrate 10 includes a transparent resin-based material, the transistor TR may be a thin film transistor (TFT). The transistor may have a gate structure such as a staggered type or a reverse staggered type. However, the gate structure is only illustrative and other modified embodiments known in the art may be employed.

In the transistor TR, a channel type (for example, a planar type, a trench type, or the like) or a shape and concentration of impurity regions S/D1 and S/D2 may be appropriately employed to reduce negative characteristics such as a short channel effect and a leakage current due to high integration. In addition, a switching element may be implemented with two or more transistors, in combination, capable of performing a non-destructive read operation. Alternatively, the switching element in place of the FET may include a nanoswitching element using a graphene or nano phenomenon and capable of access to the variable resistor Rw.

In addition, to improve integration, a vertical device such as a bipolar transistor may be utilized.

The variable resistor Rw may be formed by forming successively a first electrode BE, a solid electrolyte film SE, and a second electrode TE, and patterning the films by a photolithographic and etching process. The films may be deposited one by one and then patterned at the same time. Alternatively, deposition and patterning may be repeatedly performed for each film. For example, a first film is deposited and patterned and then a second film is deposited over the first patterned film, and on and on. The first electrode BE may be an anode electrode and the second electrode TE may be a cathode electrode, or vice versa. A description of the electrodes BE and TE will be made with reference to FIGS. 3a to 3c below.

Next, a wiring BLn (for example, a bit line configured to be electrically connected to the variable resistor Rw) may be formed on the variable resistor Rw, so that the nonvolatile memory device 100 is obtained. Conductive elements formed on the substrate (that is, the transistor TR, the variable resistor Rw, and the wirings GND, BLn, and WLn and contact pads 20 and via plugs 30 and 40 for connection thereof) may be electrically insulated by one or more insulating layers ID1, ID2, and ID3. Although not shown, the second electrode TE may be integrally formed with the wiring BLn using a single metal layer.

FIG. 1a illustrates only a portion of cell array area. Circuit components constituting a peripheral circuit adjacent to the memory cell array area, for example, a high voltage transistor, a low voltage transistor, and wiring for connection thereof may be referred to known technologies.

Figure 2A:
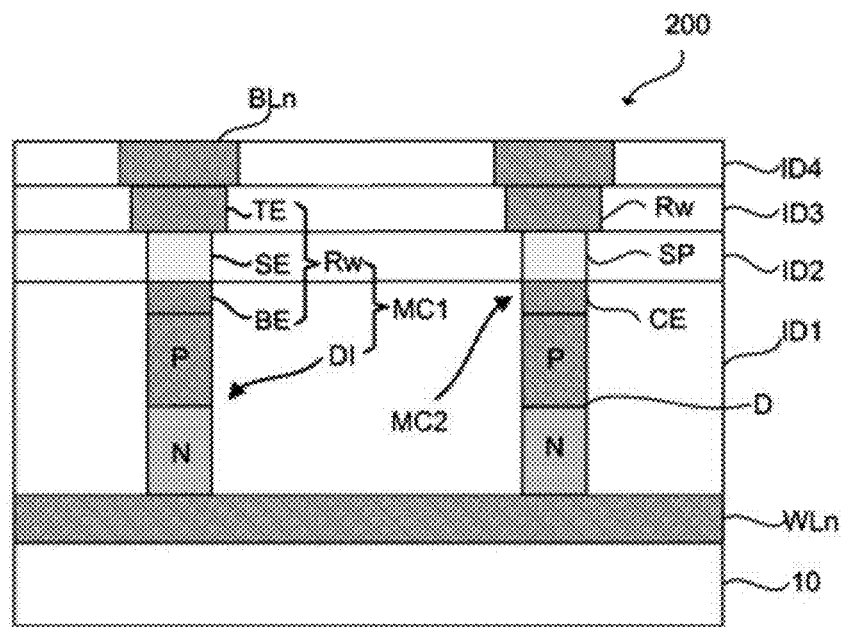
FIGS. 2a and 2b are a cross-sectional view and an equivalent circuit diagram illustrating a plurality of memory cells of a nonvolatile memory device, respectively, according to another exemplary embodiment.
Figure 2B:
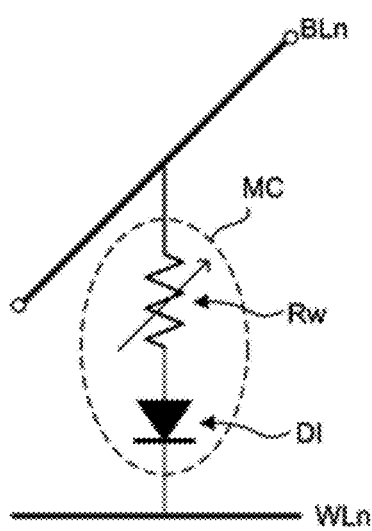

FIG. 2a is a cross-sectional view illustrating a plurality of memory cells (MCs) MC1 and MC2 of a nonvolatile memory device 200 according to another exemplary embodiment, and FIG. 2b is an equivalent circuit diagram of the plurality of memory cells (MCs) of FIG. 2a. A description about components having the same reference numerals as that of the components of FIGS. 1a and 1b may be referred to in the above-described description unless not consistent and will be omitted below.

Referring to FIGS. 2a and 2b, each of the memory cells MC, MC1, and MC2 may include a variable resistor Rw and a diode D1 configured to select a corresponding memory cell. One terminal of the variable resistor Rw may be connected to a bit line BLn and the other terminal thereof may be connected to an anode of the diode D1. A cathode of the diode D1 may be connected to a word line WLn.

The word line WLn formed on a substrate 10 may include a metal wiring pattern layer including a metal such as aluminum (Al), copper (Cu), an alloy thereof, or conductive metal oxide. Alternately, the word line WLn may include a high concentration impurity layer including n-type or p-type impurities. The metal wiring pattern layer may be created by forming a suitable metal layer on the substrate 10 and patterning the metal layer using a photolithographic and etching process, or by performing a damascene process or a dual damascene process. The high concentration impurity layer may be formed by implanting the n-type or p-type impurities into an active region of a memory cell array area of the substrate 10.

A first interlayer insulating layer ID1 such as silicon oxide or silicon nitride is formed on the word line WLn and holes are defined in the first interlayer insulating layer ID1. Surfaces of portions of the word lines WLn may be exposed through the holes. Subsequently, a semiconductor layer may be filled in each of the holes to form the diodes. When the word line is the high concentration impurity layer, the semiconductor layer for the diode may be formed on the exposed high concentration impurity layer by a selective epitaxial growth (SEG) method or a solid-phase epitaxy (SPE) method.

In another exemplary embodiment, when the word line WLn is the metal wiring pattern layer, the semiconductor layer for the diode may be formed by filling a polysilicon layer in each of the holes. Impurity regions P and N may be formed in the semiconductor layer by performing ion implantation in-situ while the semiconductor layer for the diode is deposited, or by depositing the semiconductor layer and then performing ion implantation. Next, an appropriate heat treatment process may be performed to activate impurity regions P and N for the diode D1.

The diode D1 as shown in FIG. 2A is a PN junction diode, but the diode DI is merely illustrative and embodiments are not limited thereto. For example, so long as a cell can be selected by a potential difference between the word line WLn and the bit line BLn, a polarity of the diode D1 may be reversed. In addition, in order to obtain high capacity, to enhance a ON current, or to drive multi-bit mode in the memory device, another diode having a rectifying characteristic (for example, a Shottky barrier diode having a junction of a metal wiring and a semiconductor layer, a Zener diode having a bipolar rectifying characteristic, or a p-type semiconductor-intrinsic semiconductor-n-type semiconductor (P-I-N) junction diode, or a p-type semiconductor-intrinsic semiconductor-metal (PIM) diode), may be employed in combination with the PN junction diode, or in place of the PN junction diode.

The embodiment shown in shown in FIG. 2a is different from the variable resistor Rw shown in FIG. 1a, in that the variable resistor Rw has a configuration in which the solid electrolyte film SE is filled in the hole in an interlayer insulating layer ID2. The solid electrolyte film SE is formed in the second interlayer insulating layer ID2 by forming the second interlayer insulating layer ID2, defining holes in the second interlayer insulating layer, and forming the solid electrolyte film SE in the second interlayer insulating layer ID2 to be filled within each of the holes. Next, a planarization process is performed at least until a surface of the second interlayer insulating layer ID2 is exposed to form the solid electrolyte film SE buried in each of the holes in the second interlayer insulating layer ID2.

In another exemplary embodiment, a portion of the solid electrolyte film SE may be recessed to form an area in which at least a portion of a second electrode TE, which is to be described later, may be able to be filled.

Subsequently, the second electrode TE and the bit line BLn are formed, and these elements TE and BLn may be electrically insulated from neighboring second electrode TE and neighboring bit line BLn by a third interlayer insulating layer ID3 and a fourth interlayer insulating layer ID4, respectively. In another exemplary embodiment, the second electrode TE and the bit line BLn may be provided as one piece and be formed of the same metal layer. When the second electrode TE and the bit line BLn are formed of a metal layer which is hard to etch, such as Cu or platinum (Pt), the second electrode TE and the bit line BLn may be formed through a damascene or a dual damascene process.

In the above exemplary embodiment, the bit line BLn may be any one of a plurality of bit lines and the word line WLn may be any one of a plurality of word lines. The word lines and the bit lines may have a two dimensional planar arrangement structure or a three dimensional arrangement structure. The bit lines BLn and the word lines WLn may have a plurality of stripe patterns which cross one another, and memory cells MC1 and MC2 may be arranged at intersections where the bit lines BLn and the word lines WLn cross one another so as to form a cross point array structure.

A memory cell may be addressed by selection of a word line WLn and a bit line BLn, and the memory cell is programmed by biasing the word line to a preset voltage level. A current value of the memory cell is measured through the bit line BLn so that a resistance value of the variable resistor Rw of the memory cell may be read out as information of the memory cell.

Figure 3A:
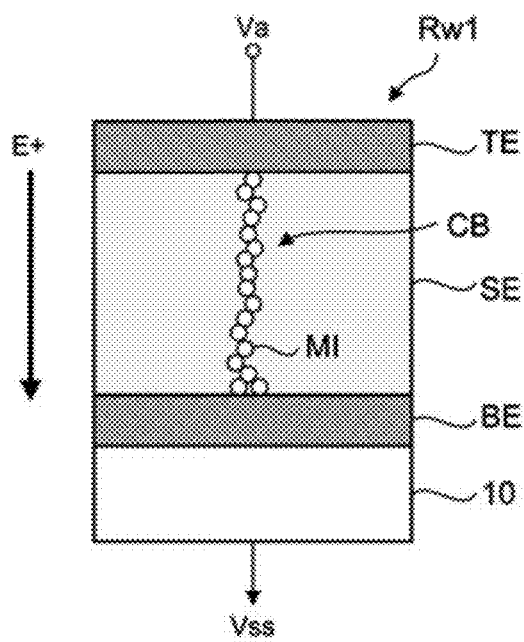
FIGS. 3a to 3c are cross-sectional views illustrating variable resistors according to various exemplary embodiments.
Figure 3B:
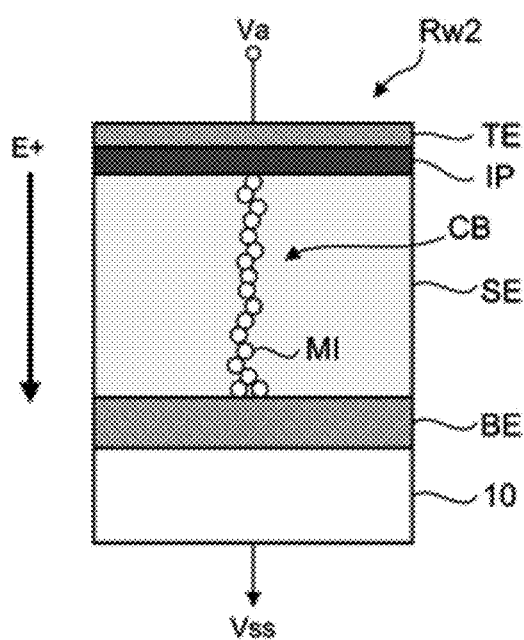
Figure 3C:
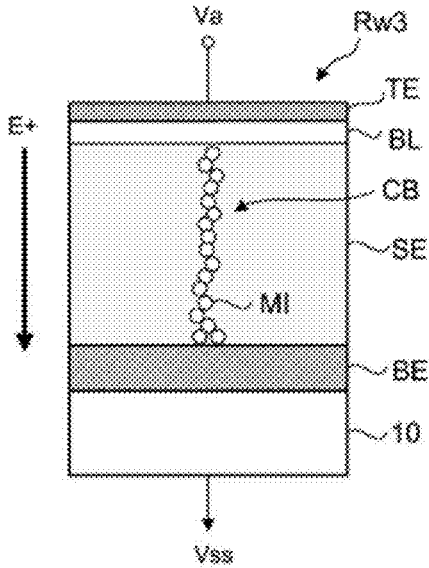

FIGS. 3a to 3c are cross-sectional views illustrating variable resistors Rw1, Rw2, and Rw3 according to various exemplary embodiments of the present invention. In FIGS. 3a to 3c, components having the same reference numerals may refer to the same or the like component unless not consistent.

Referring to FIG. 3a, the variable resistor Rw1 includes a first electrode TE and a second electrode BE formed on a substrate and facing each other. A solid electrolyte film SE is provided between the electrodes TE and BE. The substrate 10 may include a driving circuit including a switching element such as a transistor or a diode and a wiring structure for electrical connection between the variable resistor Rw1 and the driving circuit.

The solid electrolyte film SE includes a thin film of CdS nanoscale particles (hereinafter, referred to as a CdS thin film). The CdS thin film may be formed of the CdS nanoscale particles synthesized using a solution as described below, and is delivered on the substrate in a uniform dispersion solution state so that the solid electrolyte film SE entirely has substantially uniform physical and chemical characteristics. The CdS nanoscale particles substantially satisfy 1:1 stoichiometry condition and have a similar size and shape. The characteristics and advantages will be described in detail with reference to FIG. 4.

Any one of the first electrode TE and the second electrode SE may be an anode electrode and the other may be a cathode electrode. In the exemplary embodiment of FIG. 3a, for illustrative and clarity purposes, the first electrode TE is an anode electrode and the second electrode BE is a cathode electrode. The anode electrode may include an electrochemically active metal, for example, an oxidiable reactive metal such as Ag, Te, Cu, Ni, or Zn. The cathode electrode may include, for example, a relatively inert metal such as W, Au, Pt, Pd, Rh, Ir, Ru, Ti, Ta, Mo, Cr, V, a nitride thereof (for example, titanium nitride (TiN)), a silicide thereof (for example, titanium silicide (TiSi)), or any combination thereof.

In some exemplary embodiments, any one of the first electrode TE and the second electrode BE may include a stacking structure of two or more metal layers. For example, the first electrode TE which is the anode electrode may include the reactive electrode, which is in contact with the solid electrolyte film SE, such as a Cu electrode or an Ag electrode. A conductive contact electrode is formed on the reactive electrode and connected to an external wiring, for example, the contact plug (see 40 of FIG. 1a) or the bit line (see BLn of FIG. 1a). The conductive contact electrode 40 may include a contact metal layer, possibly formed of a material suitable for a general silicon-based process. In some exemplary embodiments, the conductive contact electrode may include an electrode such as the second electrode BE.

In an exemplary embodiment, at least one of the first electrode TE and the second electrode BE may include a transparent electrode. The transparent electrode may include: transparent metal oxide such as indium-tin-oxide (ITO), fluorinated tin oxide (FTO), indium oxide (IO), or tin oxide ($SnO_2$); a transparent conductive resin such as polyacetylene; a conductive resin including conductive metal particles; or any combination thereof.

Referring to FIG. 3b, the anode electrode TE may further include a metal ion supplying layer IP which is in contact with the solid electrolyte film SE. The metal ion supplying layer IP is a layer including a source of ions MI which can form a conductive bridge CB within the solid electrolyte film SE. The metal ion supplying layer IP may include a base glass material such as germanium selenide (GeSe)-based material including Cu or Ag. As the GeSe-based material, $Ge_3Se_7$, $Ge_4Se_6$, or $Ge_2Se_3$ may be utilized, but embodiments are not limited thereto. For example, other than GeSe-based material, the base glass material may be a mixed material in which a material such as S, Se, or Te is mixed with a material such as As, Sb, Ga. One possible example is $Ga_xS_{1-x}$. The metal ion supplying layer IP also may include $GeSe_2$, $Ag_2S$, CuS, or $Cu_2S$.

Referring to FIG. 3c, the variable resistor Rw may further include a diffusion barrier layer BL between the anode electrode TE and the solid electrolyte film SE. The diffusion barrier layer BL may include a metal oxide layer. For example, the metal oxide layer may include any of $SiO_x$, $AlO_x$, $NbO_x$, $TiO_x$, $CrO_x$, $VO_x$, $TaO_x$, $CuO_x$, $MgO_x$, $WO_x$, $AlNO_x$, or any combinations thereof. Here, X is a stoichiometric number of the corresponding material. But it is exemplary, the metal oxide layer may be also non-stoichiometric material. Stoichiometric material can be changed into non-stoichiometric material by adding impurities or by introducing defects, for example, vacancies.

A thickness of the diffusion barrier layer BL may be in a range of between about 3 nm to 10 nm. When the thickness of the diffusion barrier layer BL is less than about 3 nm, metal ions can easily permeate into the solid electrolyte film SE and thus it may be hard to control a doping condition. When the thickness of the diffusion barrier layer BL is more than about 10 nm, the diffusion barrier layer BL may serve as an insulator so that ion conductive characteristics between the anode electrode TE and the cathode electrode BE are reduced and accordingly variable resistance characteristics are also reduced. Therefore, the thickness of the diffusion barrier layer BL may be appropriately adjusted at such a range that ionic conduction is maintained and metal atom diffusion into the solid electrolyte film SE is controllable (for example between about 3 nm to 10 nm). In addition, a ratio of the thickness of the diffusion barrier layer to a thickness of the variable resistive layer, may be in a range of between about 0.03 to 0.1.

In some embodiments, the diffusion barrier layer BL may include a native oxide layer of the above-described metals. For example, the diffusion barrier layer BL may include $AlO_x$ which is easily formed by natural oxidation. The native oxide layer of the metal may be obtained by depositing a metal layer and performing a natural oxidation on the metal layer in air or in an ambient of oxygen. The metal layer may be formed by a deposition method in which a gas-phase metal has low kinetic energy such as an electron beam evaporation method or a laser ablation method.

Since the native oxide layer may not apply (or at least minimize) thermal energy to underlying layers when the diffusion barrier layer BL is formed, damage to the underlying layers (e.g. the substrate 10 or the CdS thin film serving as the solid electrolyte film SE) may be minimized or prevented during the formation of the diffusion barrier layer BL. As will be described with reference to FIG. 9 below, an aluminum oxide layer obtained by native oxidation of an aluminum layer, serves a good diffusion barrier layer even in about 5 nm thickness and the damage to the CdS thin film serving as the underlying solid electrolyte film SE is minimized.

Presence or absence of the metal atom diffusion layer within the CdS thin film SE serving as the solid electrolyte film SE and a function thereof may be controlled by the diffusion barrier layer BL when an anode electrode is formed in a subsequent process. Depending on the manner of its being controlled, the variable resistor Rw3 may operate as a normal bipolar switch, or as a reverse bipolar switch as will be described later.

The above-described embodiments may be combined together or substituted if necessary. For example, the modified variable resistor may include (i) the metal ion supplying layer IP described with reference to FIG. 3b, and (ii) the diffusion barrier layer BL described with reference to FIG. 3c as well. In this case, the diffusion barrier layer BL may be interposed between the metal ion supplying layer IP and the CdS thin film SE.

Figure 4:
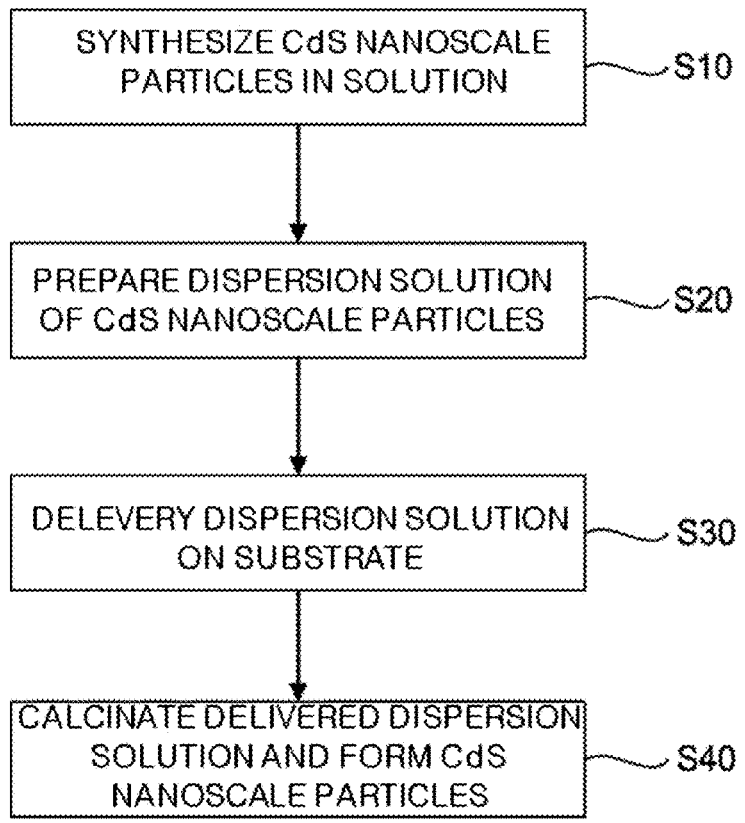
FIG. 4 is a sequence diagram illustrating a method of forming a CdS thin film according to an exemplary embodiment.

FIG. 4 is a sequence illustrating a method of forming a CdS thin film according to an exemplary embodiment of the present invention and FIGS. 5a to 5d are images obtained using a low resolution transmission electron microscope (LR-TEM), a high Resolution transmission electron microscope (HR-TEM), a Selective Area Electron Diffraction (SAED), and an X-ray diffraction (XRD), respectively, in order to analyze characteristics of synthesized CdS nanoscale particles.

Referring to FIG. 4, CdS nanoscale particles (hereinafter, referred to as CdS particles) are synthesized in a solution (S10). That is, a first solution may be prepared by dissolving a Cd precursor in a first solvent including a suitable surfactant. The Cd precursor may be selected from materials having a size from about several nm to about several thousands of nm and good solubility. The Cd precursor may include cadmium salts such as a cadmium chloride (for example, $CdCl_2$), cadmium oxide (for example, CdO), cadmium oxynitride (for example, $Cd(NO_3)_2$). Preferably, the Cd precursor may include cadmium chloride. From experiments, the cadmium chloride may have advantages as compared with cadmium oxide or cadmium oxynitride, in that when used together with an amine-based surfactant (for example oleylamine), the cadmium chloride can reduce activation energy which is related to a dissociation temperature of the Cd precursor and a synthesis temperature of the CdS particles. Thus, the cadmium chloride may be easily decomposed at a temperature below 300° C. and the CdS nanoscale particles are formed. In general, in a mass synthesis at a high temperature, a growth mechanism such as Ostwald ripening frequently occurs, so that a particle size is not easily controlled and uniformity in particle size decreases. However, the cadmium chloride can make the CdS particles synthesized at a low temperature below about 300° C. (for example 175° C.) so that the particle size may be easily controlled and CdS nano particles having uniform sizes may be obtained.

The first solvent may include any of octylamine, trioctylamine, decylamine, dodecylamine, tetradecylamine, hexadecylamine, oleylamine, octadecylamine, tribenzylamine, triphenylamine, C8- to C24-based surfactants, or a mixture thereof. In some embodiments the first solvent may be oleylamine.

The amine-based surfactant functions as a solvent and/or as a coordinating agent. The amine-based surfactant is advantageous in improving surface stability of dissociated Cd ions and synthesized CdS particles as compared with an octanoic acid, a decanoic acid, a lauric acid, a hexadecanoic acid, an oleic acid, an erucin acid, a stearic acid, a benzoic acid, or a C8 to C22 carboxylic acid such as biphenylcarboxylic acid. In addition, the amine-based surfactant may impart various three-dimensional structures (for example, a sphere, a nanorod, a tetrapod, and a tripod) to the CdS particles through change in a temperature, a molar ratio of a precursor, and a reaction time without addition of other reactants.

In some embodiments, if necessary, a cationic or anionic surfactant may be further added to the first solvent. These surfactants may make the CdS particles to grow along a specific direction. For example, the synthesized CdS particles may be dominantly grown in a longitudinal direction so as to have an elliptic shape or a rod shape. For example, the cationic surfactant may include a quaternary ammonium salt in which four hydrophobic functional groups are bonded to a nitrogen atom. The anionic surfactant may include sodium dodecylsulfate or sodium octylsulfate.

Next, the first solvent is agitated while being heated to decompose the Cd precursor. The agitation may be performed in a nitrogen atmosphere. A second solvent may be prepared. For example, the second solvent may be the same solvent as the first solvent or may be a solvent having a good miscibility with the first solvent. Sulfur powder may be dissolved in the second solvent so as to prepare a second solution.

Subsequently, the second solution is mixed with the first solution and then agitated so as to cause reaction of cadmium of the first solution with the sulfur powder of the second solution. Thereby, the CdS particles are synthesized in a mixture solution.

When the synthesis of the CdS particles is completed, the mixed solution may be cooled to a room temperature. The cooling of the mixed solution may be performed rapidly or slowly. In some embodiments, an organic solvent such as ethanol may be further added in the mixed solvent. The organic solvent may be used in cleaning the synthesized CdS particles or cooling the mixed solution rapidly.

Next, the CdS particles may be obtained from the mixed solution. For example, the CdS particles may be obtained by depressurizing the mixed solution and removing the solvent. In another exemplary embodiment, the synthesized CdS particles may be obtained by precipitating the CdS particles in the mixed solution using a centrifugal separator and separating and removing a supernatant.

Figure 5A:
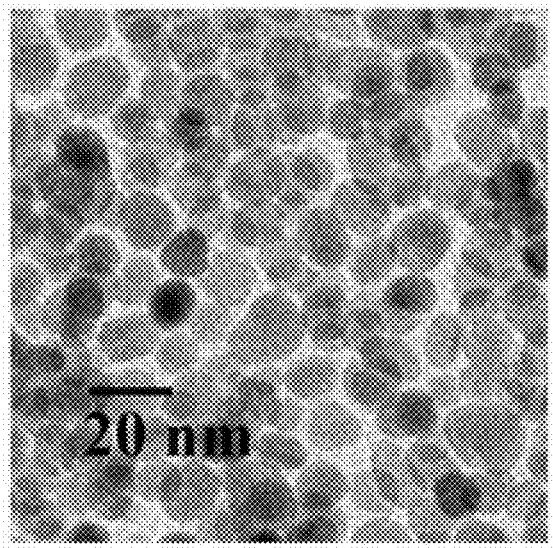
FIGS. 5a to 5d are a low resolution transmission electron microscope (LR-TEM) image, a high resolution transmission electron microscope (HR-TEM) image, a selective area electron diffraction (SAED) pattern image, and an X-ray diffraction (XRD) pattern image, respectively, to analyze characteristics of synthesized CdS nanoscale particles.

Referring to FIG. 5a, the synthesized CdS particles mostly have a spherical shape or an elliptic shape. In the synthesizing process of step S10, the CdS particles may be controlled to have an average size in a range of between about 5 nm to about 20 nm by adjusting a reaction temperature and an agitation time of the solvent. For example, the size of CdS particles may increase by increasing the agitation time and the reaction temperature. The size of CdS particles may be scaled down by reducing the agitation time and the temperature of the solvent so as to obtain the nano-scale CdS particles. As described above, the CdS particle shape may be modified by adding a suitable surfactant.

Figure 5B:
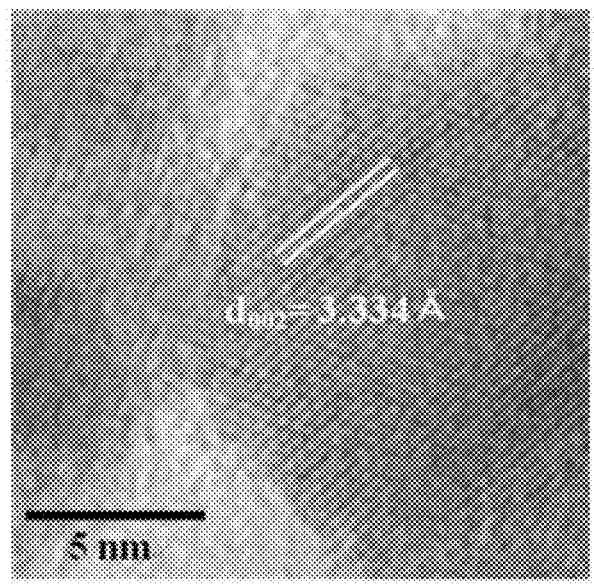

Referring to FIG. 5b, it can be seen that the CdS particles obtained according to the exemplary embodiment represent lattice fringes of a [002] crystal direction and have a good lattice plane arrangement. An inter-surface distance value measured between crystal planes (002) is $d_{002}=3.33$ Å.

Figure 5C:
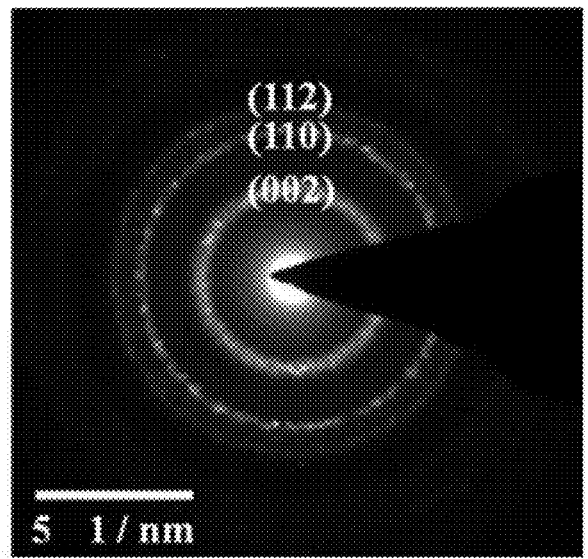
Figure 5D:
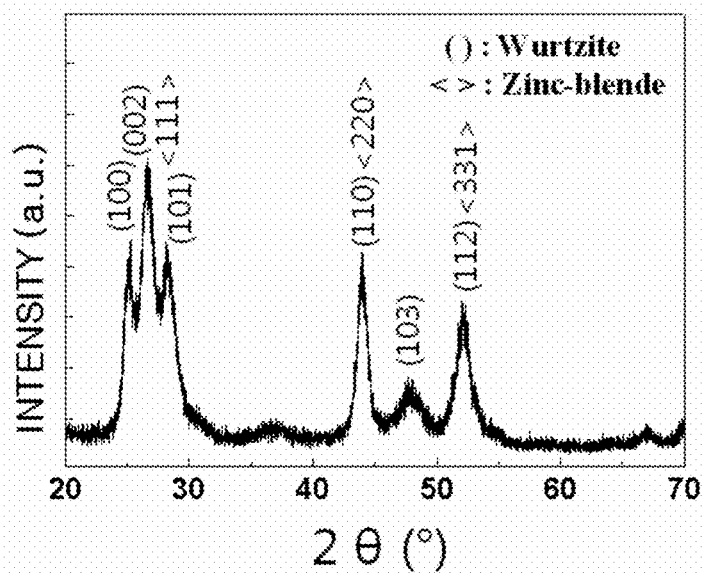

Further, crystal planes (002), (110), and (112) can be seen from FIG. 5c. Referring to FIG. 5d, the synthesized CdS particles include a Wurtzite crystal phase of planes (100), (002), (101), (110), (103), and (112), and a zinc blende crystal phase of planes (111), (220), and (331).

In the exemplary embodiment, the synthesized CdS particles formed in the solution have a stoichiometric composition ratio of substantially 1:1 and have a uniform size and shape. The stoichiometric composition ratio and the uniform size and shape of the CdS particles may contribute to a subsequent process of delivering particles to provide the basis of forming a uniform solid electrolyte film.

The obtained CdS particles are re-dispersed in a suitable organic dispersion solvent (for example chloroform) to prepare a CdS particle dispersion solution (S20). The organic dispersion solvent may be (i) a carrier fluid capable of forming a thin film or (ii) a solvent capable of maintaining dispersion stability of the CdS particles. Such a proper solvent may include a single solvent such as chloroform, N-methylpyrrolidone, acetone, cyclopentanone, cyclohexanone, methylethylketone, ethylcellosolveacetate, butylacetate, ethyleneglycol, xylene, tetrahydrofuran, dimethylformamide, chlorobenzene, and acetonitrile or a mixed solvent in which two or more of the aforementioned solvents are mixed at a certain ratio. However, these solvents are merely illustrative and embodiments are not limited to them. Preferably, the dispersion solvent may include chloroform.

Figure 6:
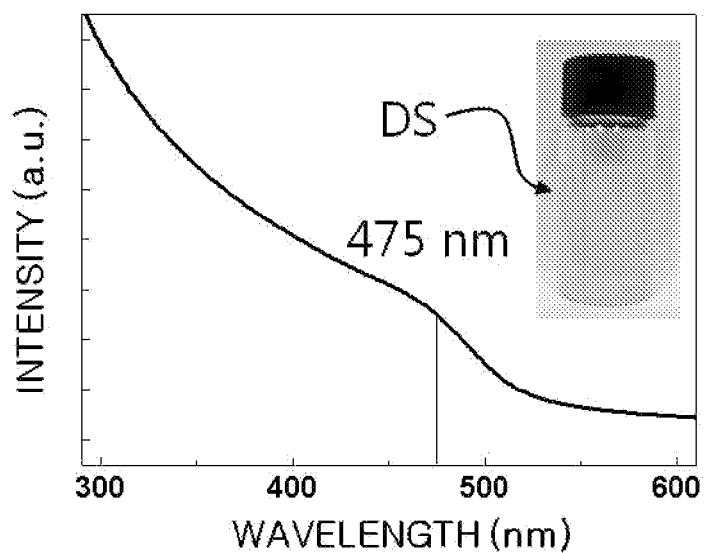
FIG. 6 is a photographic image of a dispersion solution of CdS nanoscale particles using chloroform and an ultraviolet ray-visible ray absorption spectra.

FIG. 6 shows a photographic image of a CdS particle dispersion solution (DS) using the chloroform as the dispersion solvent. That image was obtained using an ultraviolet ray-visible ray absorption spectrum. The CdS particle dispersion solution using chloroform as the dispersion solvent is yellow in color and maintains a good dispersion state for about a week or more without precipitation. This may be because the surfactants formed in the synthesis process surround peripheries of the CdS particles well. Referring to the absorption spectrum, an absorption characteristic appears about 475 nm which is an absorption peak of the CdS particles.

Subsequently, the CdS particle dispersion solution is delivered on the substrate (see 10 of FIGS. 1a to 2a) (S30). As described above with reference to FIG. 1a, the cathode electrode or the anode electrode may be formed in advance. In this embodiment, the cathode electrode is a lower electrode. In this case, the dispersion solution is delivered on the second electrode BE which is formed of, for example, a Pt electrode.

In some embodiments, a cleaning process may be performed on the substrate 10 before the delivery of the dispersion solution. The cleaning process may be performed by acetone cleaning, wet cleaning using isopropyl alcohol (IPA), plasma cleaning, excimer cleaning, or a combination thereof. In the case of the wet cleaning, if necessary an ultrasound may be applied during the cleaning.

The delivery of the dispersion solution may be performed through a droplet-coatable drop-casting method or an inkjet method. In the case of a large size, the delivery of the dispersion solution may be performed through spin coating, blade coating, dip coating, spray coating, screen printing, or flow coating, if necessary.

The drop-casting process or the inkjet process capable of droplet-coating may be applied to the delivery of the dispersion solution. In this case, micro pipettes or micronozzles may be used for the droplet-coating. The dropcasting method or the inkjet method may form a large-sized film with wasting a relatively small amount of the solution compared to the above-described wet method. In general, as a size of a substrate or wafer is large and a size of an apparatus for forming a film becomes large, it may become hard to form a film uniformly. Thus, the apparatus for forming a film becomes expensive. However, according to the exemplary embodiment, the CdS particles are prepared in a state of a dispersion solution and delivered on the substrate through the droplet-coatable dropcasting or inkjet method so that it is possible to form a uniform film of the CdS particles on a large-sized substrate with a minimum amount of consumption of a raw material. Therefore, according to the exemplary embodiment, the cost-effective delivery process may be ensured.

After the delivery of the dispersion solution on the substrate 10, a CdS thin film which is a solid electrolyte film may be formed through a calcination process (S40). The calcination process may be performed through a natural drying process or a baking process. The calcination process can be selected considering a solvent used. Preferably, the calcination process may be performed by naturally drying the dispersion solution in a room temperature. During the calcination process, only the dispersion solvent is removed and thus densification of the solid electrolyte film SE may occur by attraction force and chemical reaction between the CdS particles. In contrast with a sol-gel synthesis method (which is a typical wet film formation method of forming a film by inducing a gel state by hydrolysis), in the calcination process according to the exemplary embodiment trapping of the dispersion solution in the sol-gel synthesis method is not caused so that it is possible to prevent the solvent from being left in the solid electrolyte film SE.

In some exemplary embodiments, thermal treatment may be further performed on the calcinated CdS thin film. The heat treatment may be performed through annealing or rapid annealing in a range of 150° C. to 350° C. for several minutes. The heat treatment may be performed using an inert gas such as argon (Ar), or in a reducing environment which can be, for example, nitrogen gas ($N_2$).

A first electrode as the anode electrode (TE of FIGS. 1a and 1b) is formed on the fired CdS thin film. The first electrode may be formed through a well-known thin film fabrication process such as a sputtering method, a chemical vapor deposition (CVD) method, an electron beam evaporation method, or a laser ablation method. In some exemplary embodiments, a metal ion supplying layer IP and/or a diffusion barrier layer BL as shown in FIGS. 3b and 3c may be further formed over the solid electrolyte film SE before forming the first electrode. Subsequently, a suitable interlayer insulating layer is formed and an upper wiring, for example, a bit line BLn is formed so that a nonvolatile memory device may be completed.

According to the exemplary embodiment, CdS particles obtained by synthesizing the CdS particles in the solution satisfy a stoichiometry condition and have a uniform size and shape. The CdS particles are delivered on the substrate in state of a dispersion solution so that forming a large-sized film may be possible, which is not easily obtained by a conventional vapor-phase deposition method. In addition, according to the exemplary embodiment, a uniform film quality may be obtained over the entire CdS thin film, and the high-quality solid electrolyte film of the CdS particles may be obtained without using a vacuum apparatus and an expensive starting material. Thus, according to the exemplary embodiment, a nonvolatile memory device including programmable metallization cells (PMCs) and a method of fabricating the same which have high reliability and economic feasibility are may be provided.

Hereinafter, exemplary embodiments may be described in detail. The following disclose is for the illustrative purpose only and is not intended to be limiting of the present invention.

Embodiment 1

The CdS thin film was fabricated as follows. First, cadmium chloride of 183.3 mg as a Cd precursor was dissolved in oleylamine of 10 mL as a first solvent to prepare an oleylamine-cadmium chloride solution as a first solution. The oleyamine-cadmium chloride solution was heated in a $N_2$ ambient at a temperature of 175° C. for 35 minutes to decompose the cadmium chloride. In addition, sulfur power of 192.6 mg was dissolved in an oleylamine solvent of 5 mL as a second solvent to prepare a sulfur solution as a second solution.

Next, the sulfur solution was added into the oleylamine-cadmium chloride to induce a synthesis reaction of CdS particles by agitating the mixed solution at about 175° C. for 3 hours. When the synthesis reaction of CdS particles was completed, the mixed solution was slowly cooled to a room temperature. Ethanol of 70 mL was added to the cooled solution and the synthesized CdS particles were separated as precipitate by using a centrifugal separator with 4000 rpm. After the above-described process was repeatedly performed, for example, three times, the precipitate was re-dispersed in chloroform as a dispersion solvent to prepare a CdS particle dispersion solution.

A Ti layer (an adhesion layer) having a thickness of about 10 nm was deposited on a Si substrate with a $SiO_2$ layer formed on a surface of the Si substrate. A Pt electrode as a cathode electrode was deposited on the Ti layer to a thickness of 100 nm by an electron beam evaporation method. Next, the substrate in which the Pt electrode has been formed was cleaned and a droplet of about 7.5 μl of the CdS particle dispersion solution using a micropipette was dropped on the substrate and dried at a room temperature for about 3 minutes to calcinate the CdS particles. Subsequently, the substrate on which the CdS thin film has been coated was heat-treated in an Ar ambient at a temperature of 300° C. for 10 minutes.

Figure 7A:
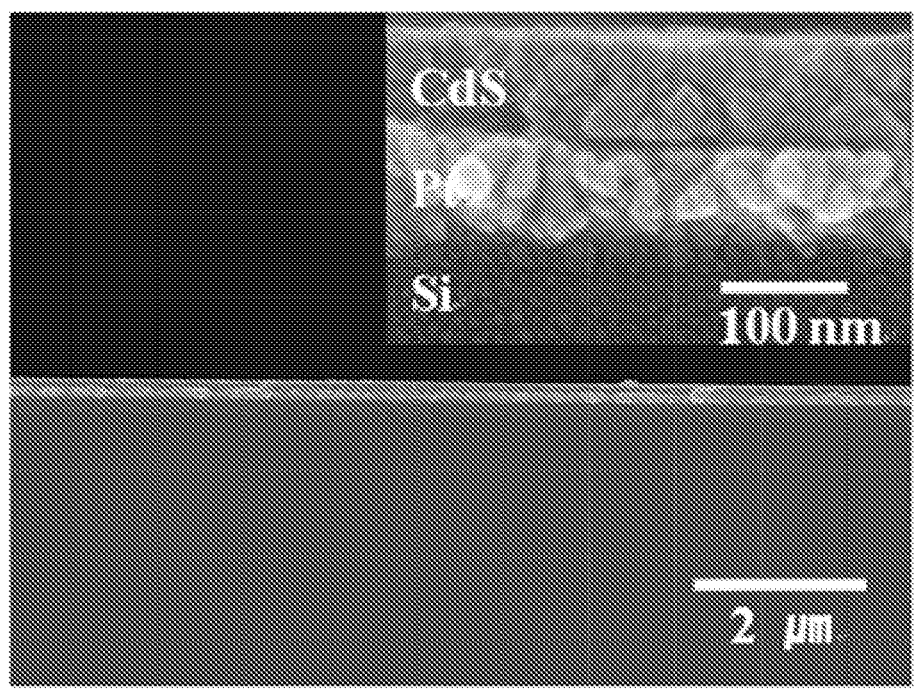
FIGS. 7a and 7b are scanning electron microscope (SEM) images showing cross-sectional structures of a variable resistor according to an exemplary embodiment.
Figure 7B:
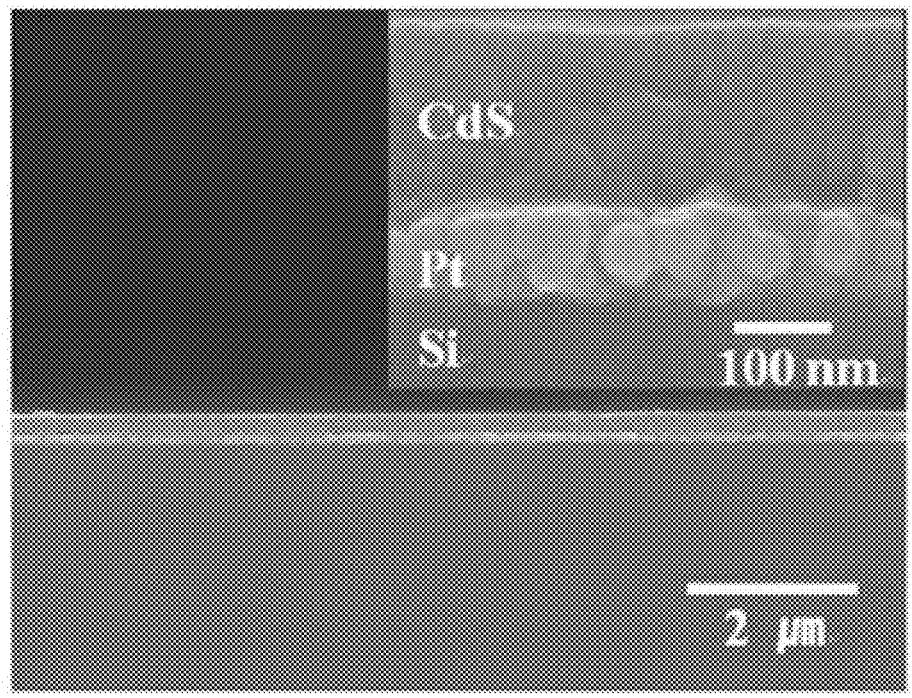

Subsequently, an Ag electrode as an anode electrode was formed on the CdS thin film by an electron beam evaporation method and then heat-treated in an Ar ambient at a temperature of 150° C. for 5 minutes again. A prepared variable resistor may have a structure of Si substrate (Si)/Pt cathode electrode (Pt)/CdS thin film (CdS)/Ag electrode (Ag, having a thickness of about 100 nm, not shown) as shown in FIGS. 7a and 7b. Two CdS thin films were obtained, i.e., one with a thickness of about 100 nm and the other with about 240 nm, respectively. The CdS thin film having a thickness of about 100 nm was fabricated from the CdS particle dispersion solution having a concentration of 4.3 mM, and the CdS thin film having a thickness of about 240 nm was fabricated from the CdS particle dispersion solution having a concentration of 9.0 mM. As such, the thicknesses of the prepared CdS thin films may be adjusted by controlling the concentration of the dispersion solution. In addition, it can be seen from the shown images that the solid electrolyte film has a uniform particle size regardless of the thickness of the solid electrolyte film.

Memory characteristics of the variable resistor obtained in the Embodiment 1 and having a thickness of about 100 nm were evaluated. FIGS. 8a to 8d are graphs showing a current-voltage (I-V) characteristic, a concentration distribution, an endurance characteristic, and a data retention characteristic of a variable resistor, respectively.

Figure 8A:
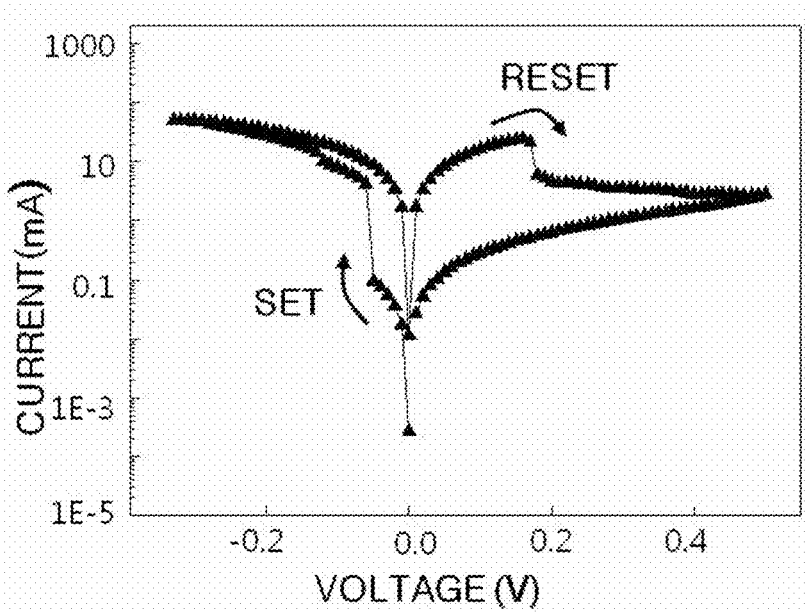
FIGS. 8a to 8d are graphs showing a current-voltage (I-V) characteristic, a concentration distribution, an endurance characteristic, and a data retention characteristic, respectively, of a variable resistor according to an embodiment.

An electrical characteristic of the variable resistor was evaluated through direct current (DC) voltage sweep at a room temperature. The variable resistor shows a bipolar switching characteristic during the voltage sweep of 0 V→0.5 V→0 V→-0.33 V→0 V at a room temperature, as shown in FIG. 8A. The bipolar switching characteristic appears without an addition process to the variable resistor obtained in Embodiment 1.

When the Pt electrode was grounded and a positive voltage was applied to the Ag electrode, a current was rapidly reduced at about 0.16 V so that the variable resistor was switched into a high resistance state (HRS) and thus became at a reset state. Meanwhile, when a negative voltage was applied to the Ag electrode, a current was rapidly increased at about -0.05 V so that the variable resistor was switched into a low resistance state (LRS) and thus became at a set state.

In a general Redox-mechanism, when a positive voltage is applied to the anode electrode, that is, the Ag electrode, a conductive bridge is formed between both electrodes by Ag cations so that the variable resistor may be in a set state while a negative voltage is applied thereto so that the conductive bridge is dissipated by reduction of Ag and thus the variable resistor may be in a reset state. However, according to Embodiment 1, it is notable that the variable resistor having a Pt/CdS/Ag structure has a reverse bipolar switching characteristic opposite to the typical Redox-mechanism which is explained above.

Figure 8B:
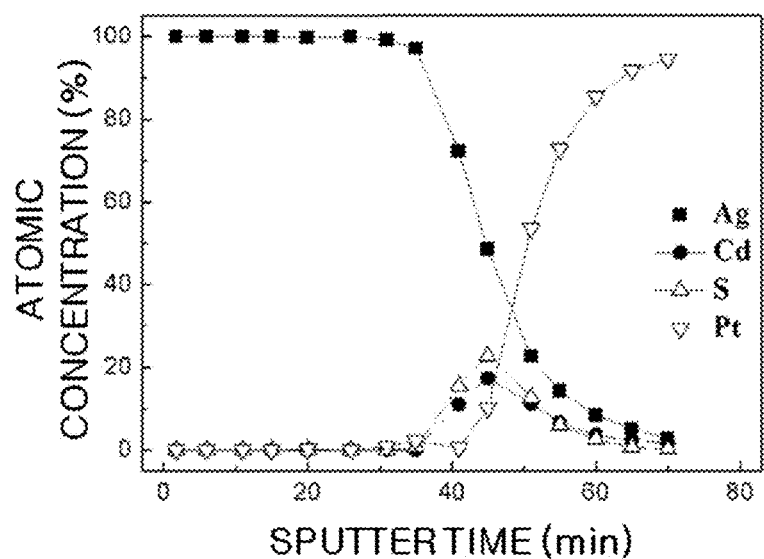

Referring to FIG. 8b, after an anode electrode (Ag) was deposited on the CdS thin film and heat-treated at a temperature of 150° C., it can be seen from an Auger electron spectroscopy analysis result of the variable resistor (Pt/CdS/Ag) that a metal atom diffusion layer is present within the CdS thin film by a thermal diffusion due to the Ag heat treatment. Herein, since the metal atom diffusion layer exists prior to the distribution of metal ions within the CdS thin film caused during the driving of the variable resistor, the metal atom diffusion layer is referred to as an initial metal atom diffusion layer. This initial metal atom diffusion layer may have a typical thermal diffusion distribution profile as shown in FIG. 8b.

It is thought that the bipolar switching characteristic which is shown in the variable resistor may result from the metal atom diffusion layer. The initial metal atom diffusion layer may function as a pre-existing filament or an initial conductive bridge in the CdS thin film. Therefore, in the variable resistor, when a positive voltage is applied to the anode, the conductive bridge itself is oxidized and a reset operation may occur by reduction of metal ions at the cathode electrode. Contrary, when a negative voltage is applied to the anode electrode, the metal ions at the cathode electrode is reduced in the initial conductive bridge and thus the conductive bridge is built again so that a set operation may occur. As such, the metal atom diffusion layer is intentionally formed within the CdS thin film by thermal diffusion from the anode electrode into the CdS thin film so that the variable resistor having the reverse bipolar switching characteristic may be provided. From the experiments, it may be expected that the reverse bipolar switching characteristic is shown when the metal ions of 20 atomic % or more are diffused into the CdS thin film.

Figure 8C:
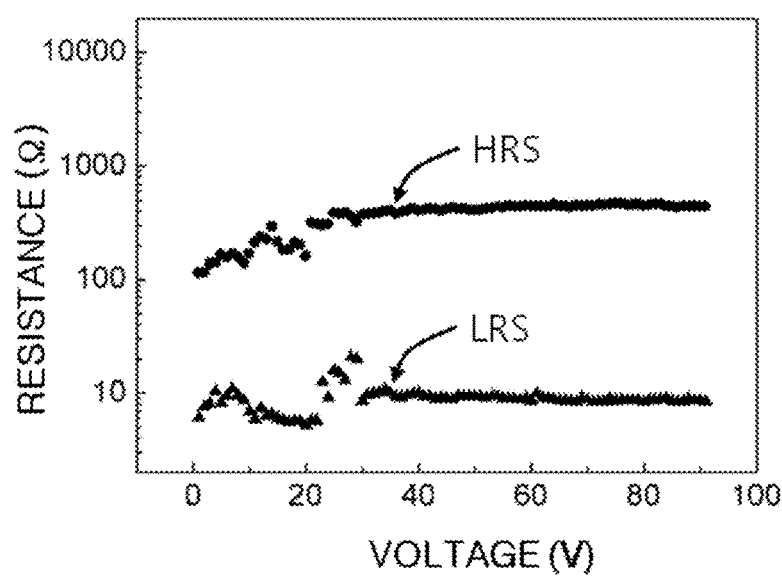
Figure 8D:
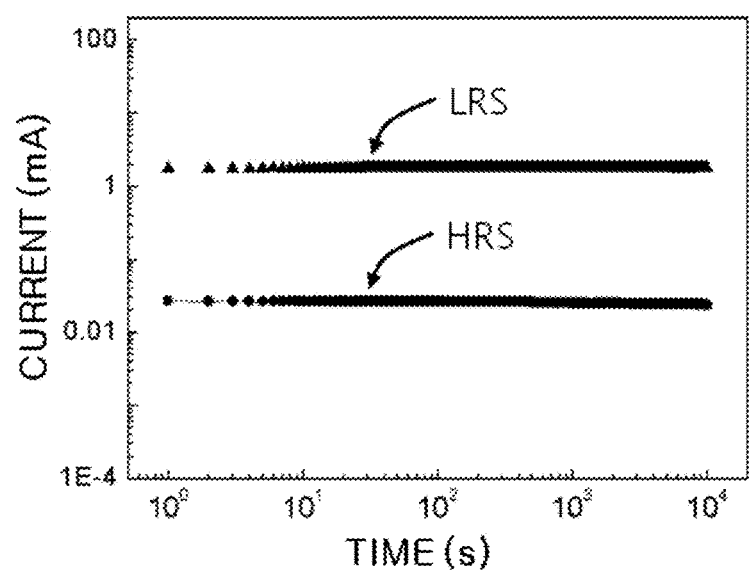

To evaluate endurance of the variable resistor, a read voltage of 0.01V was applied to measure a current value of the variable resistor. Referring to FIG. 8c, a ratio, $R_{off}/R_{on}$ is about 20 to 50, and the variable resistor has a characteristic suitable for application to an actual nonvolatile memory device. Such a characteristic was repeatedly measured so that LRS and HRS were obtained at -0.05 $V_{set}$ and 0.16 $V_{reset}$. From the cycle characteristic, it may be proposed that the initial metal atom diffusion layer maintains an initial atom distribution profile within the CdS thin film to some extent during the driving of the variable resistor. Referring to FIG. 8d, the variable resistor can maintain a stable state for $10^4$ s in the LRS and HRS states.

Embodiment 2

Differently from Embodiment 1, a diffusion barrier layer was formed between the CdS thin film and the anode electrode. The diffusion barrier layer was $Al_2O_3$ having a thickness of about 5 nm. Therefore, a variable resistor according to Embodiment 2 further includes the diffusion barrier layer (see BL of FIG. 3c) between the anode electrode (Ag) and the CdS thin film.

To form the diffusion barrier layer of $Al_2O_3$, an aluminum thin film was deposited on the CdS thin film having a thickness of 5 nm using an electron beam evaporation method. Then, after releasing a vacuum state, the aluminum thin film was maintained as it was for about 5 minutes to oxidize the aluminum thin film so that the $Al_2O_3$ thin film was formed.

Figure 9:
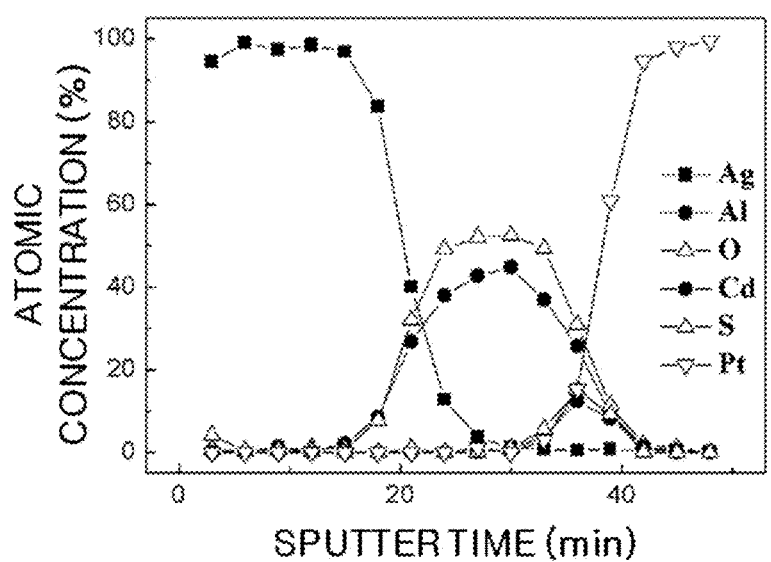
FIG. 9 is an Auger electron spectroscopy of a variable resistor (Pt/CdS/Al$_2$O$_3$/Ag) including a diffusion barrier layer of Al$_2$O$_3$.

FIG. 9 is an Auger electron spectroscopy image of a variable resistor (Pt/CdS/$Al_2O_3$/Ag) including an $Al_2O_3$ layer as a diffusion barrier layer. Referring to FIG. 9, Ag diffusion into the CdS thin film, which may occur when an Ag electrode is formed and/or annealed, can be effectively suppressed by the $Al_2O_3$ thin film. As a result, an atomic concentration of Ag within the CdS thin film can be maintained below 0.8% as shown in FIG. 9.

Figure 10A:
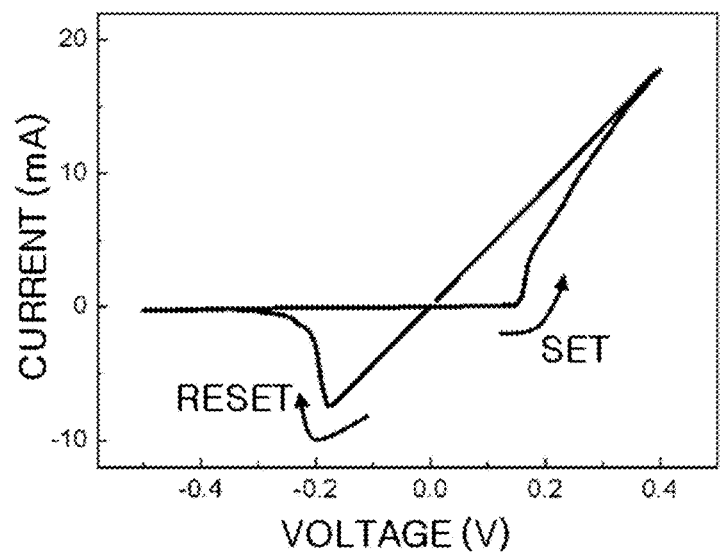
FIGS. 10a to 10c are graphs showing an I-V characteristic, an endurance characteristic, and a data retention characteristic, respectively, of a variable resistor according to an embodiment.
Figure 10B:
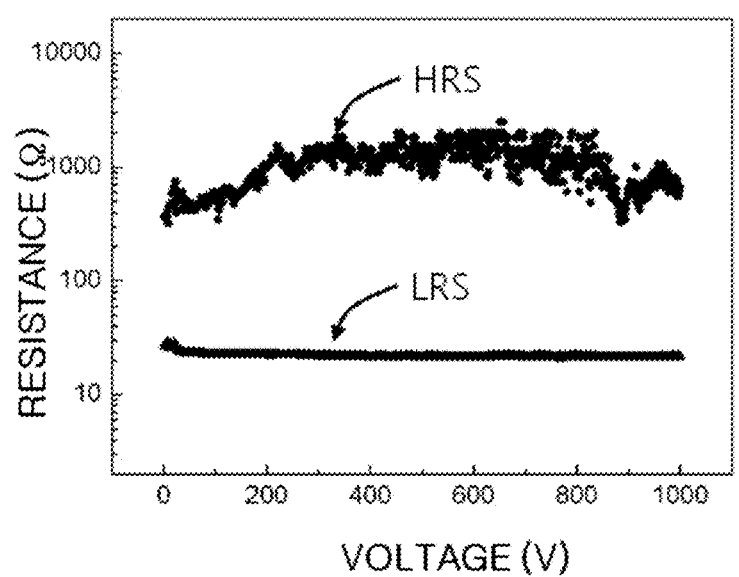
Figure 10C:
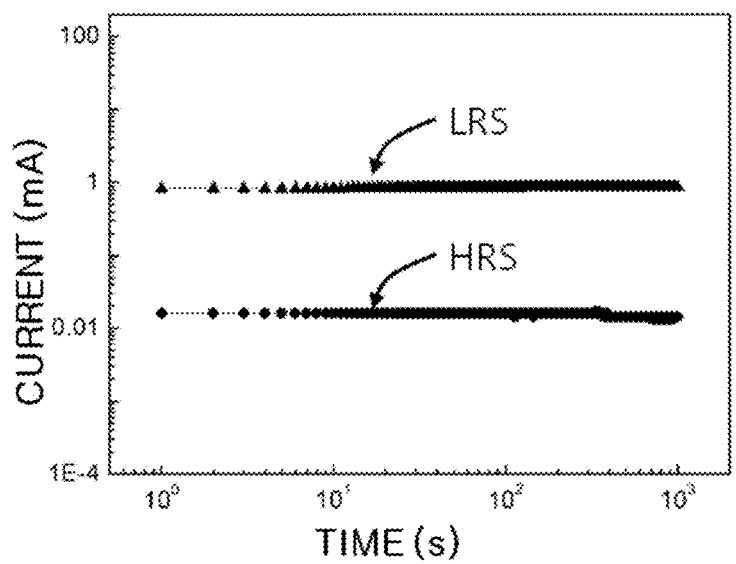

Memory characteristics the variable resistor (Pt/CdS/$Al_2O_3$/Ag) according to the Embodiment 2 were evaluated. FIGS. 10a to 10c are graphs representing an I-V characteristic, an endurance characteristic, and a data retention characteristic of the variable resistor, respectively.

Referring to FIG. 10a, the variable resistor (Pt/CdS/$Al_2O_3$/Ag) also shows a bipolar switching characteristic. However, in contrast to the bipolar switching characteristic of the variable resistor having no diffusion barrier layer illustrated in FIG. 8a, the variable resistor according to Embodiment 2 becomes in a set state when the Pt electrode is grounded and a positive voltage is applied to the Ag electrode while becomes in a reset state when a negative voltage is applied to the Ag electrode. This inversion of the polarity of the switching characteristic may be caused by the $Al_2O_3$ diffusion barrier layer. The $Al_2O_3$ diffusion barrier layer prevents a conductive bridge in the CdS thin film from being formed by diffusion of Ag into the CdS from the Ag electrode to the CdS thin film. Therefore, the driving characteristic of the variable resistor according to the Embodiment 2 may be compatible with the conventional Redox mechanism.

Referring to FIG. 10b, the variable resistor has endurance to a switching cycle of $10^3$ at a read voltage of 0.02V and a ratio of $R_{off}/R_{on}$ is above 50 on average. Referring to FIG. 10c, the variable resistor maintains a data retention characteristic without experiencing degradation for $10^3$ seconds.

Embodiment 3

Differently from Embodiment 1, the variable resistor was formed on a Kapton film which is a flexible substrate. A bending distance was fixed to 10 mm and the bending of the Kapton film was performed 40 times and 100 times. An I-V characteristic was evaluated 'before the bending' (or referred to as a non-bending state) and 'after the bending' (or referred to as a bending state).

Figure 11:
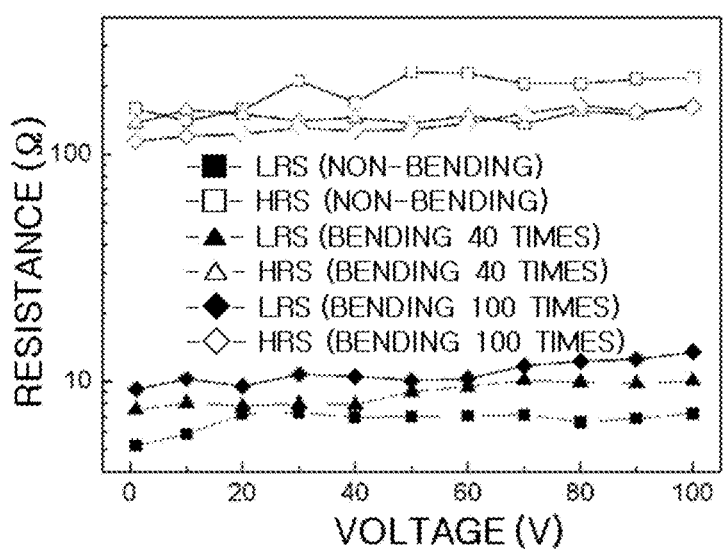
FIG. 11 is a graph showing an endurance characteristic of a variable resistor according to an embodiment, which is formed on a Kapton film.

FIG. 11 is a graph representing an endurance characteristic of the variable resistor formed on the Kapton film. Referring to FIG. 11, the variable resistor formed on the Kapton film shows good endurance having no large difference between in the non-bending state and in the bending state. Conventionally, a conductive polymer material having bistability in a resistance value has been tried to implement a flexible memory device. According to Embodiment 3, since CdS particles are synthesized in a solution and delivered in a dispersion solution so as to form the CdS thin film, uniformity in physical and chemical properties is ensured over the entire solid electrolyte film and thus it may be expected to obtain bending endurance having substantially equal level to that of the conductive polymer material.

Further, a film formed by a conventional vapor-phase deposition process is basically so dense to have a high-density matrix structure. The high-density matrix structure may restrict improvement of a mobility of metallic ions required in switching of the solid electrolyte film. However, according to Embodiment 3, as compared with the vapor-phase deposition process. the CdS thin film formed by a solution synthesis method has a relatively relaxed matrix structure and a uniform film characteristic, thereby improving the mobility of the metallic ions and ensuring the bending endurance Therefore, according to the above disclosed Embodiments, a flexible memory device having a good endurance property may be provided. The flexible memory device may be manufactured in various forms due to the deformation capacity of the device without any limitation of types of electronic appliances. Further, the embodiments may be applied as a fuse structure such as a fuse or an antifuse or a logic device.

The various nonvolatile memory devices described with reference to the appended drawings herein may be implemented into a single memory device or into a system on chip (SOC) type incorporating a heterogeneous devices, for example, logic processors, image sensors, or radio frequency (RF) devices in one wafer chip. The nonvolatile memory devices may be implemented by bonding a wafer chip, in which the nonvolatile memory device is formed, with another wafer chip, in which any heterogeneous device is formed, with an adhesive, soldering, or wafer bonding technology.

In addition, the nonvolatile memory devices according to the above-described exemplary embodiments may be implemented into various types of semiconductor packages. For example, the variable resistive memory devices according to the exemplary embodiments may be packaged in a manner such as package on package (PoP), ball grid array (BGA), chip scale package (CSP), plastic leaded chip carrier (PLCC), plastic dual in-line packages (PDIP), die in waffle pack, die in wafer FoSM, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system In package (SIP), multi chip package (MCP), wafer-level fabricated package (WFP), or wafer-level processed stack package (WSP). The packages mounted with nonvolatile memory devices according to the exemplary embodiments may further include controllers and/or logic devices configured to control the nonvolatile memory devices.

Figure 12:
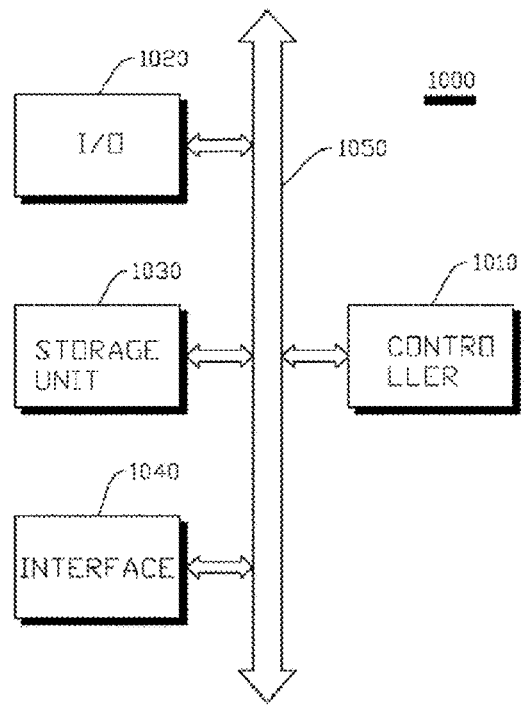
FIG. 12 is a block diagram illustrating an electronic system including a nonvolatile memory device according to exemplary embodiments.

FIG. 12 is a block diagram illustrating an electronic system 1000 including a nonvolatile memory device according to an exemplary embodiment.

Referring to FIG. 12, the electronic system 1000 according to an exemplary embodiment includes a controller 1010, an input/output (I/O) device 1020, a storage device 1030, an interface 1040, and a bus 1050. The controller 1100, the I/O device 1020, the storage device 1030, and/or the interface 1040 may be connected with each other through the bus 1050.

The controller 1010 may include at least one of a microprocessor (MP), a digital signal processor, a microcontroller, and logic devices performing functions similar thereto. The input/output unit 1020 may includes a keypad, a keyboard, or a display device. The storage device 1030 may store data and/or commands. The storage device 1030 may include the three-dimensional nonvolatile memory device which has described therein.

In some exemplary embodiments, the storage device 1030 may have a heterogeneous structure further including another type of a semiconductor device (for example, a dynamic random access memory (DRAM), a static random access memory (SRAM), and the like). The interface 1040 may transmit data to a communication network or receive data from the communication network. The interface 1040 may have a wired or wireless type and thus the interface 1040 may include an antenna or a wired or wireless transceiver. Although not shown, the electronic system 1000 may further include a high speed DRAM and/or SRAM as an operational memory which improves an operation of the controller 1010.

The electronic system 1000 may be applied to a personal digital assistant (PDA), a portable computer, a tablet personal computer (PC), a wireless phone, a mobile phone, a digital music player, a memory card, or any electronic product capable of transmitting and/or receiving information in a wireless environment.

Figure 13:
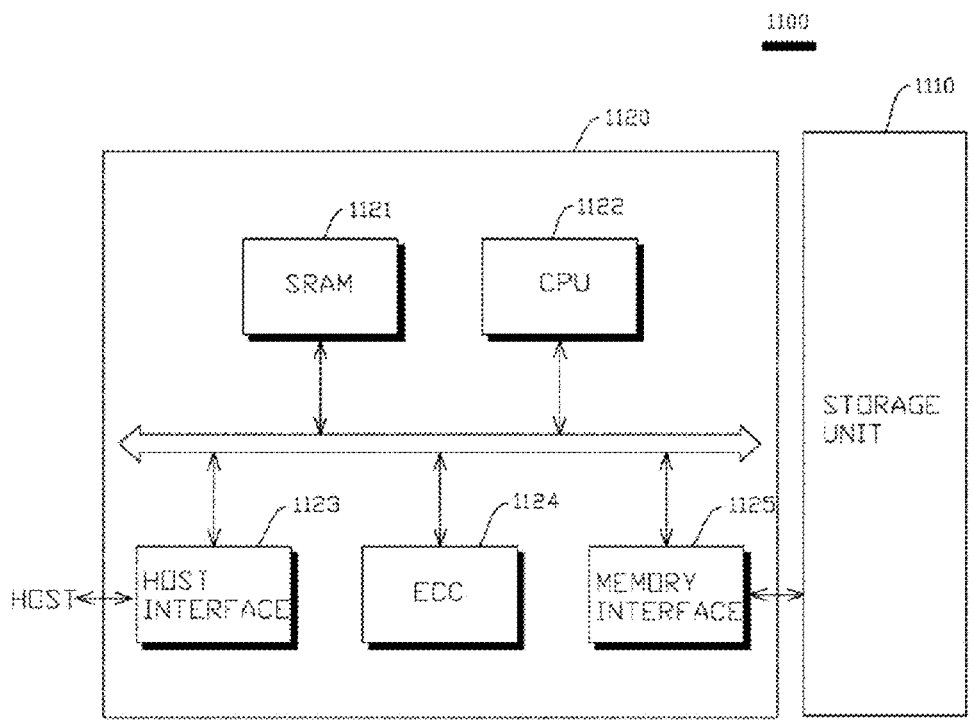
FIG. 13 is a block diagram illustrating a memory card including a nonvolatile memory device according to exemplary embodiments.

FIG. 13 is a block diagram illustrating a memory card 1100 including a nonvolatile memory device according to exemplary embodiments.

Referring to FIG. 13, the memory card 1100 according to an exemplary embodiment includes a storage unit 1110. The storage unit 1110 includes at least one of the nonvolatile memory devices according to the exemplary embodiments. The storage device 1110 may further include another type of a semiconductor memory device (for example, a DRAM, a SRAM, and the like). The memory card 1100 may further include a memory controller 1120 which controls data exchange between a host and the storage device 1110.

The memory controller 1120 may include a central processing unit (CPU) 1122 which controls an overall operation of the memory card 1100. The memory controller 1120 may include a SRAM 1211 used as an operational memory of the CPU 1122. Further, the memory controller 1120 may further include a host interface 1123 and a memory interface 1125. The host interface 1123 may include a protocol for data exchange between the memory card 1100 and the host. The memory interface 1125 may connect the memory controller 1120 and the storage device 1110. Further, the memory controller 1120 may further include an error correction block (ECC) 1124. The error correction block 1124 may detect and correct an error of data read from the storage device 1110. Although not shown, the memory card 1100 may further include a ROM device which stores code data for interfacing with the host. The memory card 1100 may be used as a portable data storage card. The memory card 1100 may include the nonvolatile memory device and may be implemented with a solid state disc (SDD) which may replace a hard disc of a computer system and thus the nonvolatile memory device according to the exemplary embodiment may provide a computing performance of petalscale and enable data I/O with high-speed.

The above-described exemplary embodiments have mainly illustrated memory devices, but are merely illustrative. It can be understood by a person with ordinary skill in the art that the variable resistor according to the exemplary embodiment may be applied as a fuse and an antifuse or an ON/OFF switching device of a logic circuit such as a field programmable gate array (FPGA).

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A variable resistor, comprising:
an anode electrode and a cathode electrode;
a variable resistive layer including cadmium sulfur (CdS) nano particles and provided between the anode electrode and the cathode electrode; and
an initial metal atom diffusion layer within the variable resistive layer,
wherein the variable resistor is a bipolar switching element configured to be in a reset state when a voltage positive with respect to the electrode cathode is applied to the anode electrode, and configured to be in a set state when a voltage negative with respect to the electrode cathode is applied to the anode electrode.

2. The variable resistor device of claim 1, wherein the initial metal atom diffusion layer includes metal elements thermally diffused from the anode electrode into the variable resistive layer.

3. A variable resistor, comprising:
an anode electrode and a cathode electrode;
a variable resistive layer including cadmium sulfur (CdS) nano particles and provided between the anode electrode and the cathode electrode; and
a diffusion barrier layer between the anode electrode and the variable resistive layer,
wherein the variable resistor is a bipolar switching element configured to be in a set state when a positive voltage relative to the cathode electrode is applied to the anode electrode, and configured to be in a reset state when a negative voltage relative to the cathode electrode is applied to the anode electrode.

4. The variable resistor of claim 3, wherein the diffusion barrier layer includes SiOx, AlOx, NbOx, TiOx, CrOx, VOx, TaOx, CuOx, MgOx, WOx, AlNOx, or any combination thereof, and
wherein X is a stoichiometric number or a non-stoichiometric number.

5. The variable resistor of claim 4, wherein the diffusion barrier layer includes a native oxide of the variable resistive layer.

6. The variable resistor of claim 4, wherein a thickness of the diffusion barrier layer is in a range of between about 3 nm to 10 nm.

7. The variable resistor of claim 4, wherein a ratio of the thickness of the diffusion barrier layer to a thickness of the variable resistive layer is in a range of between about 0.03 and about 0.1.

8. The variable resistor of claim 1, wherein the CdS nanoscale particles have an average particle diameter between about 5 nm and about 20 nm.

9. The variable resistor of claim 1, wherein the average particle diameter of the CdS nanoscale particles has a standard deviation between about zero and 4 nm over the variable resistive layer.

10. The variable resistor of claim 1, wherein the CdS nanoscale particles have a wurtzite structure, a zinc blende structure, or any combination structure thereof.

11. The variable resistor of claim 1, wherein the CdS nanoscale particles satisfy a 1:1 stoichiometric composition ratio.

12. The variable resistor of claim 1, wherein anode electrode includes silver (Ag), tellurium (Te), copper (Cu), nickel (Ni), zinc (Zn), or any combination thereof.

13. The variable resistor of claim 1, wherein the cathode electrode includes tungsten (W), gold (Au), platinum (Pt), palladium (Pd), rhodium (Rh), iridium (Ir), ruthenium (Ru), titanium (Ti), tantalum (Ta), molybdenum (Mo), chrome (Cr), vanadium (V), a nitride thereof, a silicide thereof, or any combination thereof.

14. The variable resistor of claim 1, the variable resistor further includes:
   a metal ion supplying layer provided between the anode electrode and the diffusion barrier layer.

15. The variable resistor of claim 14, wherein the metal ion supplying layer includes germanium selenium (GeSe)-containing compound, a germanium sulfur (GeS)-containing compound, a copper sulfur (CuS)-containing compound, a silver sulfur (AgS)-containing compound, or a combination thereof.

16. The variable resistor of claim 1, wherein the variable resistor is formed over a flexible substrate.

17. A nonvolatile memory device comprising the variable resistor of claim 1.

* * * * *